US012022678B2

(12) United States Patent
Lin et al.

(10) Patent No.: US 12,022,678 B2
(45) Date of Patent: *Jun. 25, 2024

(54) ELECTRONIC DEVICE

(71) Applicant: InnoLux Corporation, Miao-Li County (TW)

(72) Inventors: Hsiao-Lang Lin, Miao-Li County (TW); Tsung-Han Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/858,946

(22) Filed: Jul. 6, 2022

(65) Prior Publication Data

US 2022/0344617 A1 Oct. 27, 2022

Related U.S. Application Data

(63) Continuation of application No. 16/886,811, filed on May 29, 2020, now Pat. No. 11,411,198.

(30) Foreign Application Priority Data

Jun. 18, 2019 (CN) .......................... 201910528051.4

(51) Int. Cl.
*H10K 50/842* (2023.01)
*H01L 25/075* (2006.01)
(Continued)

(52) U.S. Cl.
CPC ..... *H10K 50/8426* (2023.02); *H01L 25/0753* (2013.01); *H01L 33/54* (2013.01); *H10K 59/90* (2023.02)

(58) Field of Classification Search
CPC ............... H01L 25/0753; H01L 25/048; H01L 51/5246; H01L 51/525
See application file for complete search history.

(56) References Cited

U.S. PATENT DOCUMENTS 5,537,235 A * 7/1996 Ishihara ................ G02F 1/1341
349/158
11,411,198 B2 * 8/2022 Lin ........................ H01L 51/525
(Continued)

FOREIGN PATENT DOCUMENTS

CN 101794707 A 8/2010
CN 103426896 A 12/2013
(Continued)

*Primary Examiner* — Feifei Yeung Lopez
(74) *Attorney, Agent, or Firm* — Winston Hsu

(57) ABSTRACT

A display device having an active region and a non-active region, includes a first substrate, a second substrate, and a sealing layer. The first substrate includes a first substrate layer, a plurality of light-emitting units disposed on the first substrate layer in the active region, and a plurality of dams disposed on the first substrate layer in the non-active region. The second substrate includes a plurality of light conversion units in the active region. The sealing layer is disposed between the first substrate and the second substrate, wherein the sealing layer includes a first portion disposed in the non-active region and a second portion disposed in the active region, and the first portion and the second portion are continuous, wherein at least a part of the first portion of the sealing layer is disposed between at least two of the plurality of dams.

20 Claims, 17 Drawing Sheets

(51) Int. Cl.
*H01L 33/54* (2010.01)
*H10K 59/90* (2023.01)

(56) References Cited

U.S. PATENT DOCUMENTS

| | | | | |
|---|---|---|---|---|
| 2001/0005257 A1* | 6/2001 | Yamada | ............. | G02F 1/13392 349/110 |
| 2004/0004434 A1* | 1/2004 | Nishi | ................. | H01L 51/5246 313/506 |
| 2007/0018566 A1* | 1/2007 | Yamazaki | ............ | H01L 51/525 313/498 |
| 2008/0036367 A1 | 2/2008 | Eida | | |
| 2013/0049184 A1 | 2/2013 | Kasahara | | |
| 2015/0090982 A1* | 4/2015 | Lin | .................... | H01L 27/3246 257/40 |
| 2015/0293280 A1* | 10/2015 | Lee | ...................... | G03F 7/0007 359/891 |
| 2017/0170247 A1* | 6/2017 | Kim | ................... | H01L 51/5234 |

FOREIGN PATENT DOCUMENTS

| | | |
|---|---|---|
| CN | 107329303 A | 11/2017 |
| JP | 2003-243154 A | 8/2003 |
| KR | 10-2007-0049172 A | 5/2007 |

\* cited by examiner

ELECTRONIC DEVICE

CROSS REFERENCE TO RELATED APPLICATIONS

This application is a continuation application of U.S. application Ser. No. 16/886,811, filed on May 29, 2020. The content of the application is incorporated herein by reference.

BACKGROUND OF THE DISCLOSURE

1. Field of the Disclosure

The present disclosure relates generally to a display device and more particularly, to a display device having two attached substrates.

2. Description of the Prior Art

Electronic devices include flat display panels, which are widely accepted for its thinner thickness, lighter weight, and lower power consumption, so as to be widely used in variety of electronic devices in information viewing technology.

Generally, currently manufactured and sold flat display panels are mainly formed by bonding or pressing two substrates which are in alignment with each other. A light-emitting region disposed on the bottom substrate may be aligned with a color filter layer disposed on the upper substrate. However, during the assembly and bonding process, the bottom substrate and the upper substrate may be displaced or rotated by a certain angle to cause alignment error, thereby leading to alignment shift. Thus, it is still urgent to those of skilled in the art to ensure the accurate alignment between substrates.

SUMMARY OF THE DISCLOSURE

The present disclosure provides a display device having an active region and a non-active region includes a first substrate, a second substrate, and a sealing layer. The first substrate includes a plurality of light-emitting units in the active region. The second substrate includes a plurality of light conversion units in the active region. The sealing layer is disposed between the first substrate and the second substrate, on the active region and the non-active region.

The present disclosure provides a display device having an active region and a non-active region, includes a first substrate, a second substrate, and a sealing layer. The first substrate includes a first substrate layer, a plurality of light-emitting units disposed on the first substrate layer in the active region, and a plurality of dams disposed on the first substrate layer in the non-active region. The second substrate includes a plurality of light conversion units in the active region. The sealing layer is disposed between the first substrate and the second substrate, wherein the sealing layer includes a first portion disposed in the non-active region and a second portion disposed in the active region, and the first portion and the second portion are continuous, wherein at least a part of the first portion of the sealing layer is disposed between at least two of the plurality of dams.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. For purposes of illustrative clarity understood, various drawings of this disclosure show a portion of the electronic device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. In the following description and in the claims, the terms "include", "comprise" and "have" are used in an open-ended fashion, and thus should be interpreted to mean "include, but not limited to".

It may also understand that when an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

It may also understand that when an element or layer is "disposed on" another element or layer, it can be directly disposed on the another element or layer, or intervening elements or layers may be presented. In contrast, when an element is referred to as being "directly disposed on" another element or layer, there are no intervening elements or layers presented.

The technical features in different embodiments described in the following can be replaced, recombined, or mixed with one another to constitute another embodiment without departing from the spirit of the present disclosure.

Figure 1:
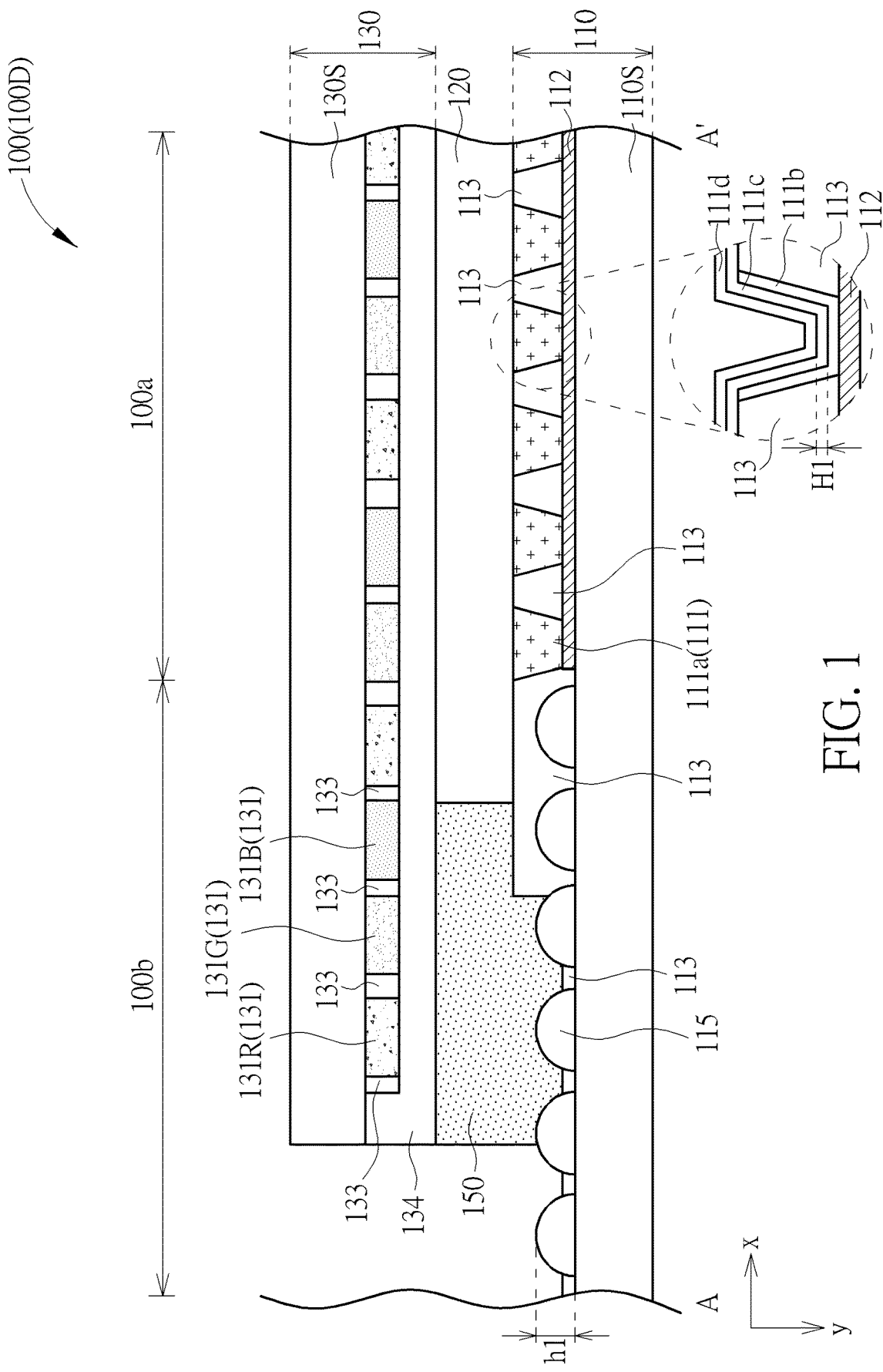
FIG. 1 is a schematic diagram illustrating a cross-sectional view of an electronic device according to a first embodiment of the present disclosure.
Figure 2B:
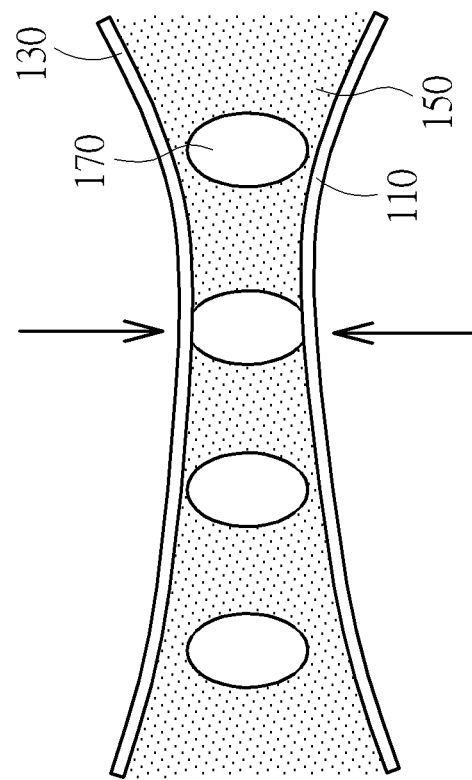
FIG. 2B is another schematic diagram illustrating a cross-sectional view of a sealing layer in the electronic device according to the first embodiment of the present disclosure.
Figure 2A:
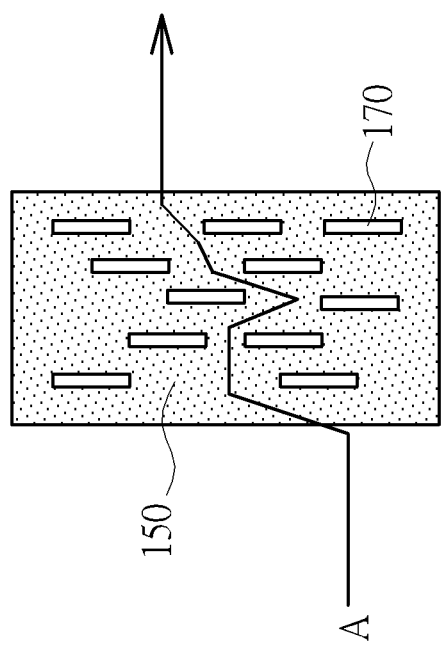
FIG. 2A is a schematic diagram illustrating a cross-sectional view of a sealing layer in the electronic device according to the first embodiment of the present disclosure.

Please refers to FIG. 1, FIG. 2A and FIG. 2B, which show cross-sectional views of an electronic device according to the first embodiment of the present disclosure. As shown in FIG. 1, an electronic device 100 of a first embodiment includes a display device 100D, and the display device 100D can include a first substrate 110 and a second substrate 130 disposed opposite to each other, and the first substrate 110 and the second substrate 130 may respectively include a substrate layer. In FIG. 1, the first substrate 110 includes a first substrate layer 110S, and the second substrate 130 includes a second substrate layer 130S. The substrate layer 110S and/or the substrate layer 130S can be a transparent substrate, such as a rigid substrate or a flexible substrate, wherein a material thereof may include glass, quartz, polyimide (PI), polyethylene terephthalate (PET), polycarbonate (PC), Poly(ether sulfones) (PES), polybutylene terephthalate (PBT), polyethylene naphthalate (PEN), polyarylate (PAR), other suitable materials or a combination thereof for example, but is not limited thereto. A display layer 111 is disposed on a surface (for example a top surface or an inner surface) of the first substrate layer 110S, and a light conversion layer 131 is disposed on a surface (for example a bottom surface or an inner surface) of the second substrate layer 130S opposite to the first substrate layer 110S. In the present embodiment, the display layer 111 includes a plurality of light-emitting units 111a which are respectively disposed in a plurality pixel region (not shown in the drawing) defined by a pixel defining layer (PDL) 113. It is noted that, through the disposing positions of the light-emitting units 111a in the display layer 111, the display device 100D may be divided into an active region 100a and a non-active region 100b. In other words, a portion surrounded by the outermost edge of the outermost light-emitting unit 111a may be defined as the active region 100a, and the non-active region 100b is disposed at the outside of the active region 100a. In one embodiment, in a top view direction perpendicular to a surface of the first substrate 110 or the second substrate 130, the non-active region 100b may surround the active region 100a. When the first substrate 110 or the second substrate 130 extends along a horizontal direction x, the top view direction may be the direction y. Each of the light-emitting units 111a may be a self-light-emitting module, such as an organic light-emitting diode (OLED) capable of emitting white light, blue light, or ultraviolet light, or an inorganic light-emitting diode. The inorganic light-emitting diode may be a micro light-emitting diode, a mini light-emitting diode or a quantum dot light-emitting diode (QLED/DQLED) for example, but not limited thereto. Each of the light-emitting units 111a may be respectively controlled by at least one switching element disposed on the first substrate layer 110S, and the switching element may be a thin-film transistor (TFT) such as an amorphous thin-film transistor, a low temperature polysilicon thin-film transistor, or a metal-oxide thin-film transistor, but not limited thereto. In FIG. 1, a thin-film transistor layer 112 is illustrated to include a plurality of the switching elements for explanation.

A plurality of dams 115 can be disposed on a surface of the first substrate layer 110S and in the non-active region 100b. The probability of water and oxygen entering the electronic device 100 from the first substrate 110 can be reduced. In the present embodiment, each of the light-emitting units 111a may include a bottom electrode layer 111b, a light-emitting layer 111c and a top electrode layer 111d stacked sequentially as shown in FIG. 1. However, the said stacked layers of each light-emitting unit 111a are only for example and are not limited thereto. The dams 115 have a height h1 (namely, the height between the highest point and the lowest point of the dam 115 as shown in FIG. 1), and the height h1 of the dams 115 may be not less than the thickness H1 of the light-emitting layer 111c, for example, being about 1.35 to 1.85 times of the thickness H1 of the light-emitting layer 111c, but not limited thereto. The dams 115 may be optionally formed together with the pixel defining layer 113, so as to include the same material as that of the pixel defining layer 113, such as a dielectric material or an organic material. The dams 115 may also be formed through an additional process and include a monolayer insulating structure or a multilayer insulating structure. In one embodiment, the dams 115 for example include an inorganic material/organic material/inorganic material (I.O.I.) structure, wherein the organic material may include photoresist material, polyfluoroallkoxy (PFA), other suitable organic material or a combination thereof, and the inorganic material may include silicon oxide, silicon nitride or a combination thereof, but not limited thereto. Also, one skilled in the art can understand that, in FIG. 1, although the dams 115 of the present embodiment is located at one side of the active region 100a, the dams 115 may surround the outer periphery of the active region 100a in a top view (for example, a direction opposite to the direction y illustrated in FIG. 1), for example being dispersed in the non-active region 100b. On the other hand, although the dams 115 are illustrated in a semicircular shape, the practical shape or structure thereof is not limited thereto, but may be further adjusted according to the product requirements. For example, in one embodiment, dams with a trapezoidal section or a rectangular section (not shown in the drawings) may be optionally formed, or in another embodiment, dams may be disposed at other locations (not shown in the drawings) such as on the second substrate layer 130S or on a planarization layer 134.

The light conversion layer 131 can be disposed on the display layer 111, and can include a plurality of light conversion units 131R, light conversion units 131G, light conversion units 131B at least partially overlapped with corresponding light-emitting units 111a respectively in a top view direction (such as the direction y) perpendicular to the surface of the first substrate 110 or the second substrate 130. Precisely speaking, each of the light conversion units 131R, each of the light conversion units 131G, and each of the light conversion units 131B are separately disposed by a shielding layer 133 on the second substrate layer 130S. The light conversion units 131R, the light conversion units 131G and the light conversion units 131B may but not limited to be quantum dot materials, fluorescent materials, phosphorescent materials, dyes or pigments. In one example, the light conversion units 131R, the light conversion units 131G and the light conversion units 131B shown in FIG. 1 may include quantum dot materials, wherein the quantum dot material or the quantum dot particles in the light conversion unit 131R are capable of converting the light emitted by the light-emitting unit 111a into red light; similarly, the quantum dot material or the quantum dot particles in the light conversion unit 131G are capable of converting the light emitted by the light-emitting unit 111a into green light; and the quantum dot material or the quantum dot particles in the light conversion unit 131B are capable of converting the light emitted by the light-emitting unit 111a into blue light. However, in some embodiments, each light-emitting unit 111a can generate blue light, the light conversion units 131B may not include blue quantum dot material or blue quantum dot particles), or, a material incapable of color conversion may be disposed in the position of the light conversion units 131B.

Furthermore, the display device 100D can include a sealing layer 150 disposed between the first substrate 110 and the second substrate 130, and the sealing layer 150 may include an adhesive material like resin, epoxy, glue or polymer, or a material for isolating oxygen and water, such as frit glass. In one embodiment, the material of the sealing layer 150 can be selected according to the subsequent curing process. For example, the sealing layer 150 can be selected from a thermally curable material such as tetrafluoroethylene polymer, hexafluoropropylene polymer or two-component mixed hardened glue (AB glue), a photocurable material such as apolysiloxane, polyurethane, polybutyl or triblock copolymer, a photocurable or thermally curable material such as esterified epoxy(meth)acrylate resin, photopolymerization initiator, thermosetting agent or organic acid hydrazide, other suitable material or a combination thereof, but not limited thereto. In another embodiment, the material of the sealing layer 150 may also be selected from a fluid type or fluid-like type sealing material, such as a plastic sealing paste such as modified asphalt or coal tar, an elastoplastic sealing paste such as polyvinyl chloride (PVC) cement or plastic ointment, an elastic sealing paste such as polysulfide rubber, silicone rubber, neoprene, polyurethane or acrylic naphthalene, a polymer sealing material such as polyvinyl alcohol (PVA), or other waterproof materials which may meet the requirements of the process to form a band-shaped section, a strip-shaped section or a pad-shaped section. In another embodiment, the sealing layer 150 may further include a plurality of supporting elements 170 (as shown in FIG. 2A and FIG. 2B) having supporting elasticity, bendability or deformability. The supporting elements 170 have a length being about 0.5 micrometers (μm) to 5 μm, and the material of the supporting element 170 may include plastic core, glass ball, photoinitiator, acrylate resin, esterified epoxy, synthetic resin, fiber, spacer, polymer core, other suitable materials or a combination thereof, but not limited thereto. The synthetic resin for example includes polyethylene resin, polystyrene resin or polyacrylic resin, but is not limited thereto. In other words, in some embodiments, the sealing layer 150 includes the supporting elements 170, and the supporting elements 170 may include one or more aforementioned materials at the same time, or include one or more materials having different functions, for example including a combination of elastomers and non-elastomer. In another embodiment, the supporting element may be formed to have various sections such as a trapezoidal section, a rectangular section, or a spherical section (not shown in the drawings), but not limited thereto.

It is noted that, the sealing layer 150 of the present embodiment is disposed in the non-active region 100b of the electronic device 100, to at least cover a portion of the dams 115 and a portion of the pixel defining layer 113 on the first substrate layer 110S, and to cover a portion of the planarization layer 134 on the second substrate layer 130S, as shown in FIG. 1. Although the sidewall at one side of the sealing layer 150 in the present embodiment is exemplified by being vertically aligned with the sidewall of the second substrate 130, the practical setting of the sealing layer 150 is not limited thereto. For example, the sidewall of the sealing layer 150 may be slightly arc or irregular (not shown in the drawings) under various practical process requirements, or the sealing layer 150 may be disposed to further cover the sidewall of the second substrate layer 130S or the sidewall of the film layers (such as the light conversion layer 131) disposed on the second substrate layer 130S, or even to cover the sidewall of the first substrate layer 110S or the sidewall of the film layers (such as the display layer 111) disposed on the first substrate layer 110S.

Accordingly, the first substrate 110 may be adhered to the second substrate 130 through the sealing layer 150, to ensure each of the light-emitting units 111a in the first substrate 110 being actually in alignment with each of the light conversion units 131R, the light conversion units 131G and the light conversion units 131B in the second substrate 130 to avoid misalignment. On the other hand, gaps within the sealing layer 150 have good uniformity, and which may be beneficial on blocking the intrusion of water and oxygen from the two sides of the electronic device 100, to prevent from the damages to the display layer 111. In particular, in the embodiment of having the supporting elements 170 in the sealing layer 150, the arrangement of the supporting elements 170 may lengthen the path A of water and oxygen as shown in FIG. 2A, for blocking the water and oxygen more effectively, or may further adjust the uniformity of the gaps between the first substrate 110 and the second substrate 130, for providing a supporting force while the electronic device 100 is subjected to deformation or bending by an external force (such as the direction of an arrow), as shown in FIG. 2B.

Furthermore, the electronic device 100 of the present embodiment includes a space 120 in the active region 100a. The air in the space 120 has a refractive index which is different from that of the first substrate layer 110S and the second substrate layer 130S, and the different refractive indexes therebetween may cause the optical power loss of the display layer 111. Precisely speaking, the refractive indexes of the first substrate layer 110S and the second substrate layer 130S are about 1.38 to 1.60, the refractive indexes of the display layer 111 on the first substrate layer 110S and the light conversion layer 131 on the second substrate layer 130S are about 1.42 to 1.59, and the refractive index of air is about 1.0 which is far different from the refractive indexes of other films, thereby leading to possible mismatches of refractive index. Generally, the refractive index of the electronic device 100 is mainly analyzed by integrally measuring the refractive index of the first substrate layer 110S (or the second substrate layer 130S) and all the films disposed thereon through an instrument. Alternately, in some situation, the refractive index of the electronic device 100 may also be analyzed by firstly peeling off the materials of each film respectively, using a Fourier-transform infrared spectroscopy (FTIR) to distinguish the type of the materials, and then, searching the refractive indexes thereof via a classification table of the materials.

Thus, one skilled in the art can easily realize the electronic device in the present disclosure is not limited to the aforementioned embodiment, and may further include other examples or variety under the practical product requirements. The following description will detail the different embodiments of the electronic device in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 3:
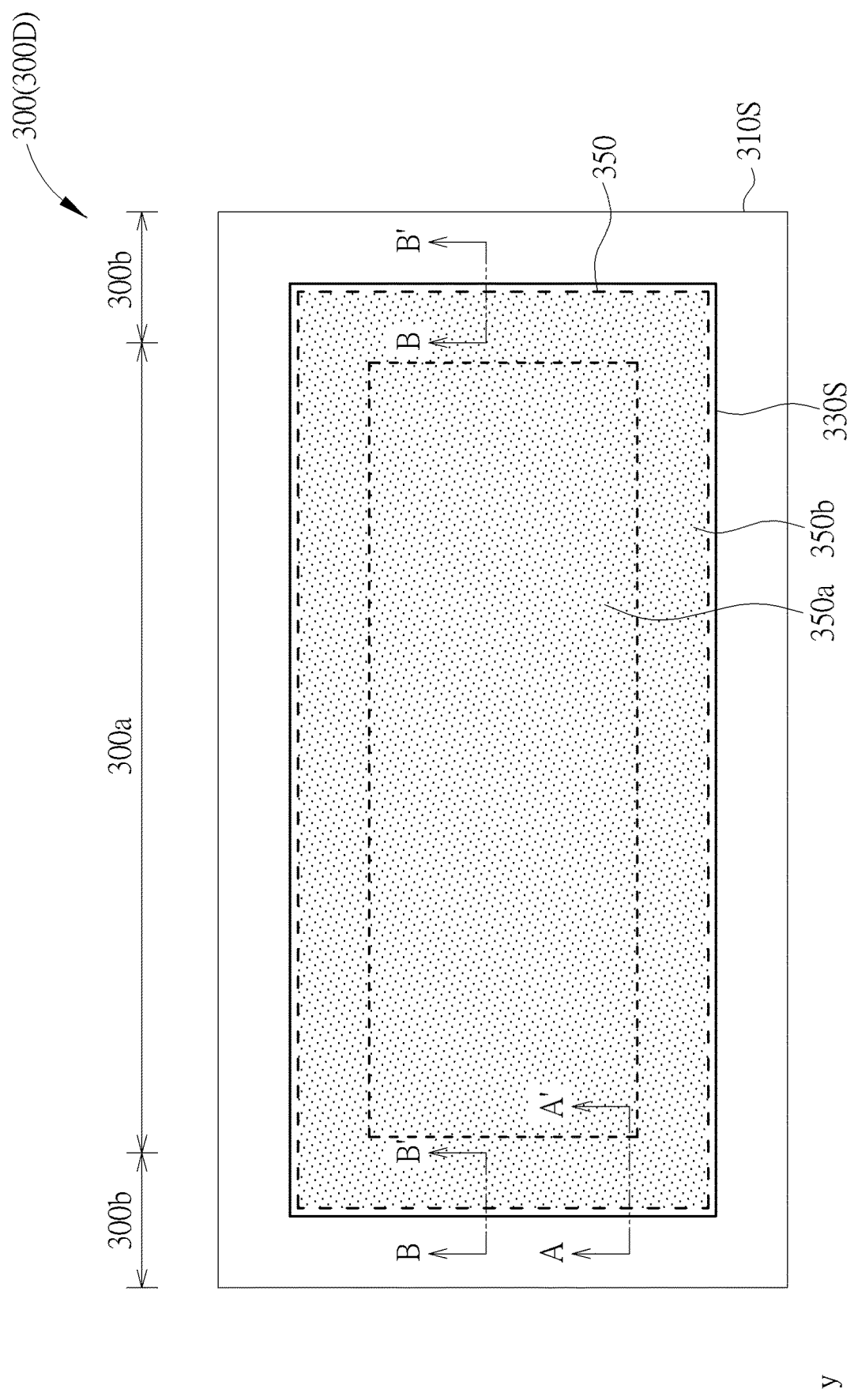
FIG. 3 is a schematic diagram illustrating a top view of an electronic device according to a second embodiment of the present disclosure.
Figure 4:
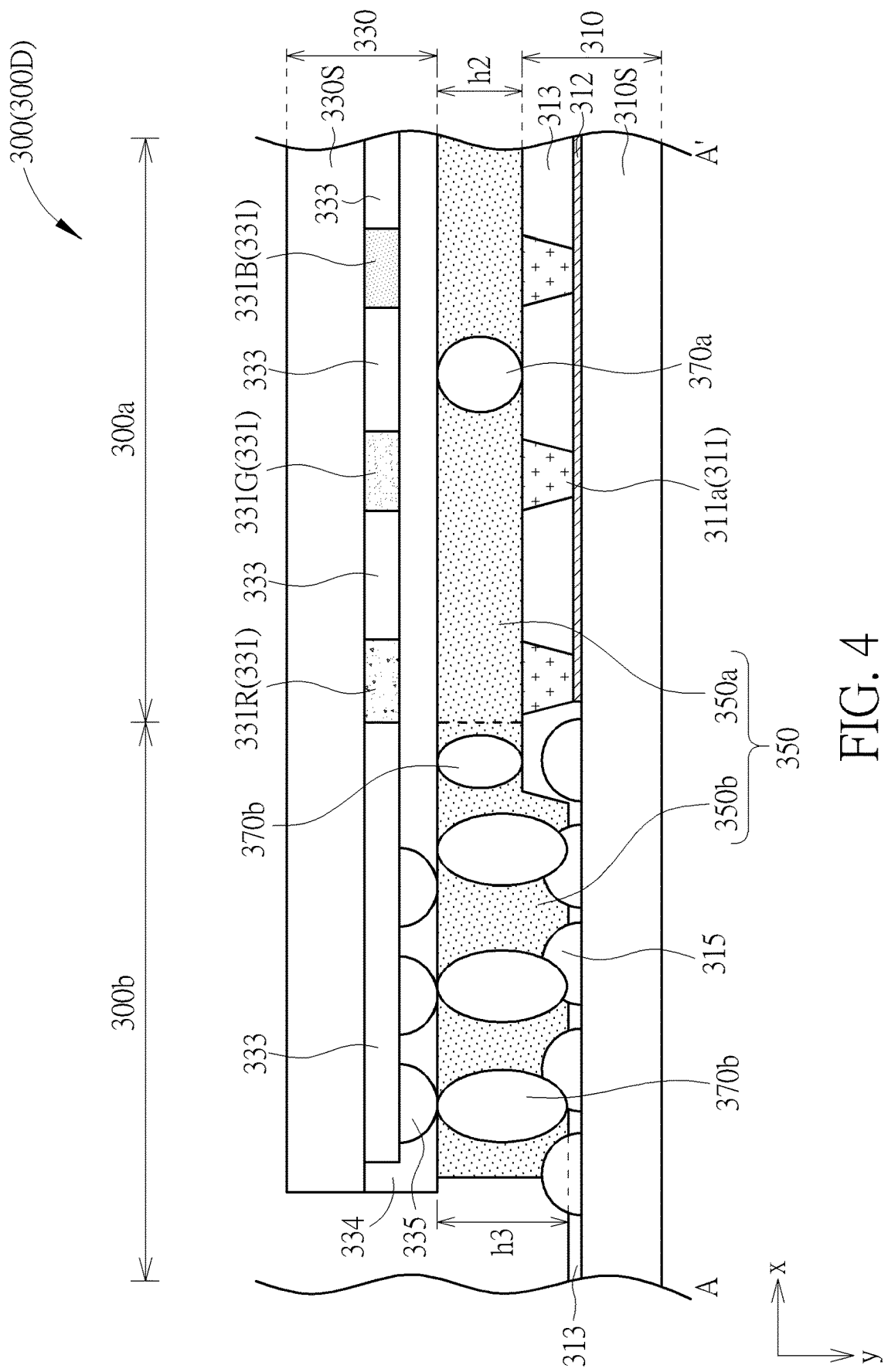
FIG. 4 is a schematic diagram illustrating a cross-sectional view of the electronic device according to the second embodiment of the present disclosure.

Please refer to FIG. 3 to FIG. 9, illustrating schematic diagrams of an electronic device 300 according to the second embodiment of the present disclosure, in which FIG. 3 shows a top view (along the direction y) of the electronic device 300, and FIG. 4 to FIG. 9 show cross-sectional views taken along a cross line A-A' or a cross line B-B' in FIG. 3. As shown in FIG. 3 and FIG. 4, the electronic device 300 of the second embodiment includes a display device 300D, and the display device 300D includes an active region 300a and a non-active region 300b surrounding at an outer periphery of the active region 300a. Similar to the first embodiment, the display device 300D can include a first substrate 310 and a second substrate 330. The first substrate 310 can include a first substrate layer 310S, and a display layer 311, a pixel defining layer (PDL) 313 and a thin-film transistor layer 312 disposed on the first substrate layer 310S. The second substrate 330 can include a second substrate layer 330S, and a light conversion layer 331, a light shielding layer 333 and a planarization layer 334 disposed on the second substrate layer 330S. The aforementioned elements are substantially the same as those in the first embodiment, and will not be redundantly described thereinafter. The difference between the present embodiment and the aforementioned embodiment is in that the light conversion layer 331 may be optionally disposed only in the active region 300a, and the light shielding layer 333 may further extend to the non-active region 300b, and at least one dam 335 may be disposed on the light shielding layer 333. Moreover, a sealing layer 350 of the present embodiment is extended from the active region 300a to the non-active region 300b, so that, a sealing layer 350b disposed in the non-active region 300b (hereinafter referred as a first portion 350b) may surround a sealing layer 350a disposed in the active region 300a (hereinafter referred as a second portion 350a) in atop view direction (such as the direction y) being perpendicular to the first substrate layer 310S or the second substrate layer 330S, as shown in FIG. 3. The second portion 350a further includes a gap-filling function, and which may fill in the space (for example the space 120 as shown in FIG. 1) in the active region 300a, to improve the issue that the refractive index of air affecting the function of the light-emitting units 311a. Also, the refractive index of the sealing layer 350 may be about 1.3 to 1.6, which is similar to the refractive indexes of the first substrate layer 310S, the second substrate layer 330S, and the films (such as the display layer 311 and the light conversion layer 331) disposed thereon, so as to improve the loss of optical power. in other words, refractive indexes match should be important at display device.

In the present embodiment, the material of the sealing layer 350 is substantially the same as that of the first embodiment, and the materials of the first portion 350b and the second portion 350a may be optionally the same or different based on practical process requirements. Precisely speaking, the second portion 350a may optionally include a highly transparent material, or the aforementioned thermally curable material or the photocurable or thermally curable material, for preventing the issue that the material or the curing process (such as the UV exposure) of the sealing layer 350 affect the functions of the light-emitting units 311a and each of the light conversion units 331R, the light conversion units 331G and the light conversion units 331B. On the other hands, the first portion 350b may optionally include a material with a higher viscosity for example with a viscosity being greater than 4 centipoise (cps), so that, the first portion 350b may become more compact, thereby preventing the intrusion of water and oxygen to the active region 300a. In the present embodiment, the viscosity of the sealing layer 350 refers to the viscosity of the material before curing. For example, the viscosity can be measured by a suitable viscometer or rheometer with a shearing rate of about $10^6/s^2$ solid amounts, under 150° C. It is noted that, a sticky material may be discontinuously poured out from a height in per unit of time instead of being continuously poured out, due to the influence of a shearing force or a cutting force, and the weight of the sticky material which is discontinuously poured in per unit of time refers to the shearing rate.

Besides the materials, the first portion 350b and the second portion 350a may include other differences, such as the disposing thickness, or the disposing conditions of the supporting elements (including the material, length, density or supporting force) which are shown in Table 1 below. In the present embodiment, the second portion 350a has a thickness h2 (namely the thickness of the thickest portion of the second portion 350a) in a direction (such as the direction y) being perpendicular to the first substrate layer 310S or the second substrate layer 330S, and the thickness h2 is for example 1 micrometers (μm) or more, and 10 μm or less. The first portion 350b has a thickness h3 (namely the thickness of the thickest portion of the first portion 350b), and the thickness h3 may be greater than the thickness h2 of the second portion 350a. Furthermore, the supporting elements 370a disposed in the second portion 350a has a length for example being 0.5 μm to 3 μm, and supporting elements 370b disposed in the first portion 350b has a relative greater length, for example being about 1.5 times to 2 times of the length of the supporting elements 370a, but are not limited thereto. Also, the supporting elements 370a disposed in the second portion 350a may include a relative greater supporting force, for example being greater than about 3.0 kgf/cm², such that, the active region 300a with greater deformation and stress may provide relative greater elastic supporting while the electronic device 300 is subjected to deformation or bending. The supporting elements 370a disposed in the second portion 350a may optionally include a relative smaller disposing density, for example disposing about 1 to 10 supporting elements 370a in per unit volume of sealing layer 350, but not limited thereto. In an overall example, the sealing layer 350 may be exemplified by having the second portion 350a, wherein the thickness h2 thereof for example is greater than or equal to 2 µm, and less than or equal to 4 µm, the length of the supporting elements 370a disposed therein is for example 3 µm, the disposing density of the supporting elements 370a is for example 1-10/µm³, and the supporting force of each supporting element 370a is about 4.0 kgf/cm²; and having the first portion 350b, wherein the thickness h3 thereof for example is greater than or equal to 4 µm, and less than or equal to 6 µm, the length of the supporting elements 370b disposed therein is for example 4.5 µm, the disposing density of the supporting elements 370b is for example 10-100/µm³, and the supporting force of each supporting element 370b is about 2.0 kgf/cm², but not limited thereto.

TABLE 1 disposing difference between the first portion 350b and the second portion 350a

|  | First Portion 350b | Second Portion 350a |
| --- | --- | --- |
| Viscosity of Sealing Layer | Relative Greater (>4 cps) | Relative Smaller (<6 cps) |
| Thickness of Sealing Layer | Relative Thicker (≥4.5 µm, ≤15 µm) | Relative Thinner (≥1.0 µm, ≤10 µm) |
| Length of Supporting Elements | Relative Greater (0.75-6 µm) | Relative Smaller (0.5-3.0 µm) |
| Supporting Force of Supporting Elements | Relative Smaller (<4.0 kgf/cm²) | Relative Higher (>3.0 kgf/cm²) |
| Disposing Density of Supporting Elements | Relative Higher (10-100/µm³) | Relative Smaller (1-10/µm³) |

In one embodiment, due to the height differences caused by the film layers or the elements disposed on the first substrate layer 310S, in the active region 300a, the supporting elements 370b disposed in the first portion 350b may optionally include more than one length, as shown in FIG. 4. In another embodiment, the supporting elements 370a and the supporting elements 370b may include various colors and shapes. For example, the supporting elements 370a and the supporting elements 370b may include black color to separate the interferences of light leakages between each of the light conversion units 331R, the light conversion units 331G and the light conversion units 331B. The supporting elements 370a and the supporting elements 370b may include a round shape or an oval shape as shown in FIG. 4, or include a rectangular shape. It is noteworthy that the supporting elements 370a and the supporting elements 370b may include different materials based on different manufacturing processes. For example, the supporting elements 370a and the supporting elements 370b may include a photo supporting element, including a material like plastic core, acrylate resin, esterified epoxy resin, or photoinitiator. A photo material is first coated and subjected to exposure to form a pattern, thus forming the photo supporting element on the first substrate 310 or the second substrate 330. Alternatively, the supporting elements 370a and the supporting elements 370b may include a ball supporting element, including a material like synthetic resin, plastic core or glass beads, and the ball supporting element is firstly formed outside, and transferred to the first substrate 310 or the second substrate 330. Alternatively, the supporting elements 370a and the supporting elements 370b may include an adhesive supporting element, including plastic cores, plastic microspheres or an adhesive material, and the adhesive supporting element is formed by firstly coating an adhesive layer (not shown in the drawings) outside, transferring the adhesive layer to the first substrate 310 or the second substrate 330, and fixing the adhesive layer on the first substrate 310 or the second substrate 330 by melting the adhesive layer via a photo curing or a thermally curing method in the subsequent curing process.

Figure 5:
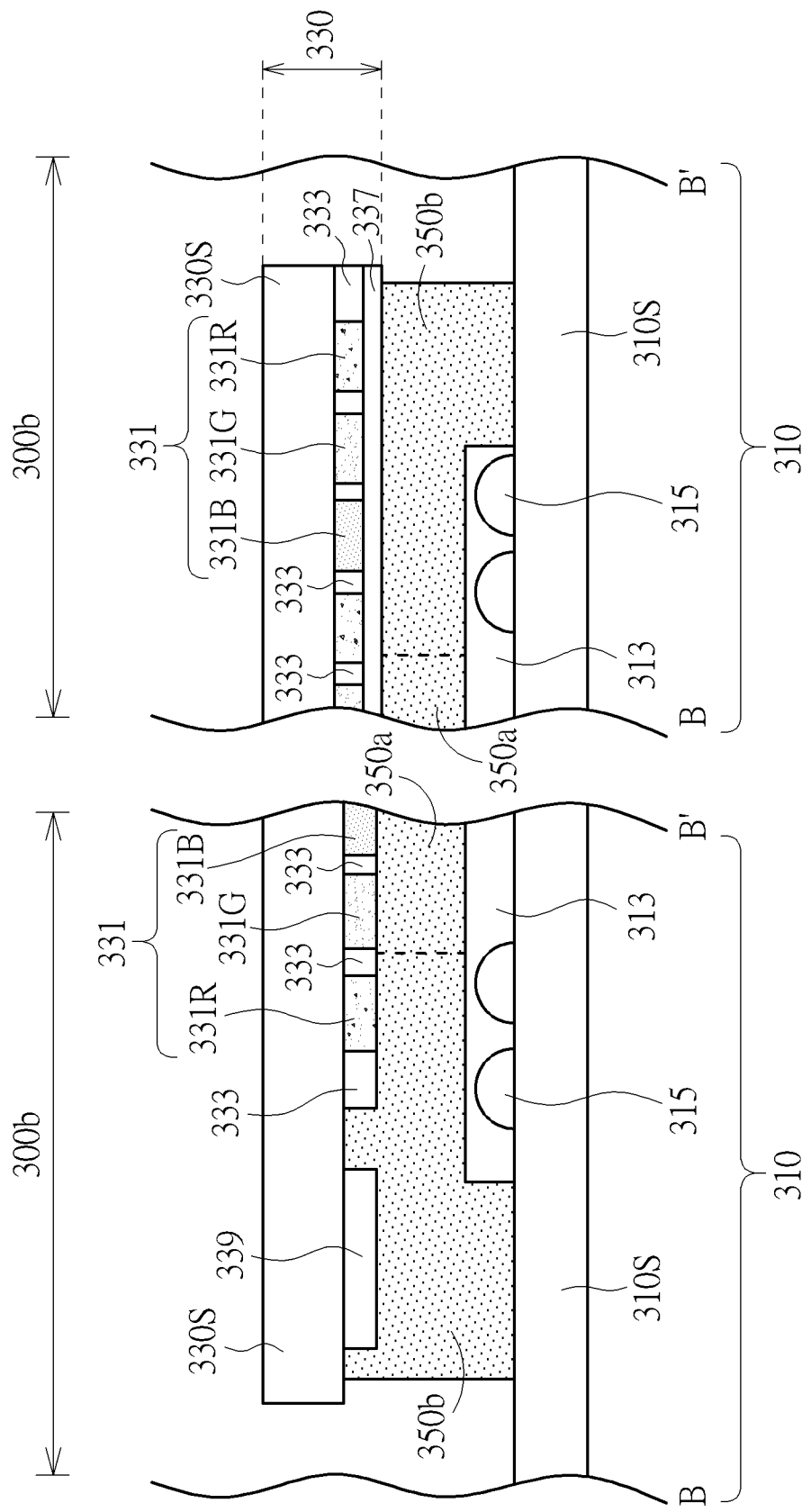
FIG. 5 is a schematic diagram illustrating a cross-sectional view of a non-active region in the electronic device according to the second embodiment of the present disclosure.

It is noted that, when the first portion 350b and the second portion 350a include different materials, the second portion 350a may extend as far as possible into the non-active region 300b to cover each element disposed in the non-active region 300b. In other words, the interface between the first portion 350b and the second portion 350a may also be located in the non-active region 300b (as shown in FIG. 5 to FIG. 9) instead of being located at the interface between the active region 300a and the non-active region 300b. For example, in one embodiment, when a portion of the light conversion layer 331 further extends into the non-active region 300b to function like a dummy light conversion unit, the second portion 350a may be disposed on the portion of the light conversion layer 331, or disposed on a transparent conductive layer 337 disposed on the portion of the light conversion layer 331, as shown in FIG. 5. In FIG. 3 to FIG. 5, although the boundary between the first portion 350b and the second portion 350a is shown by a dashed line, people skilled in the art may understand that the practical boundary between the first portion 350b and the second portion 350a may not be clearly distinguished in a practical process. For example, the first portion 350b and the second portion 350a may be slightly mixed with each other at the boundary, thus no obvious boundary can be seen, or the boundary may be of an irregular shape.

Figure 6:
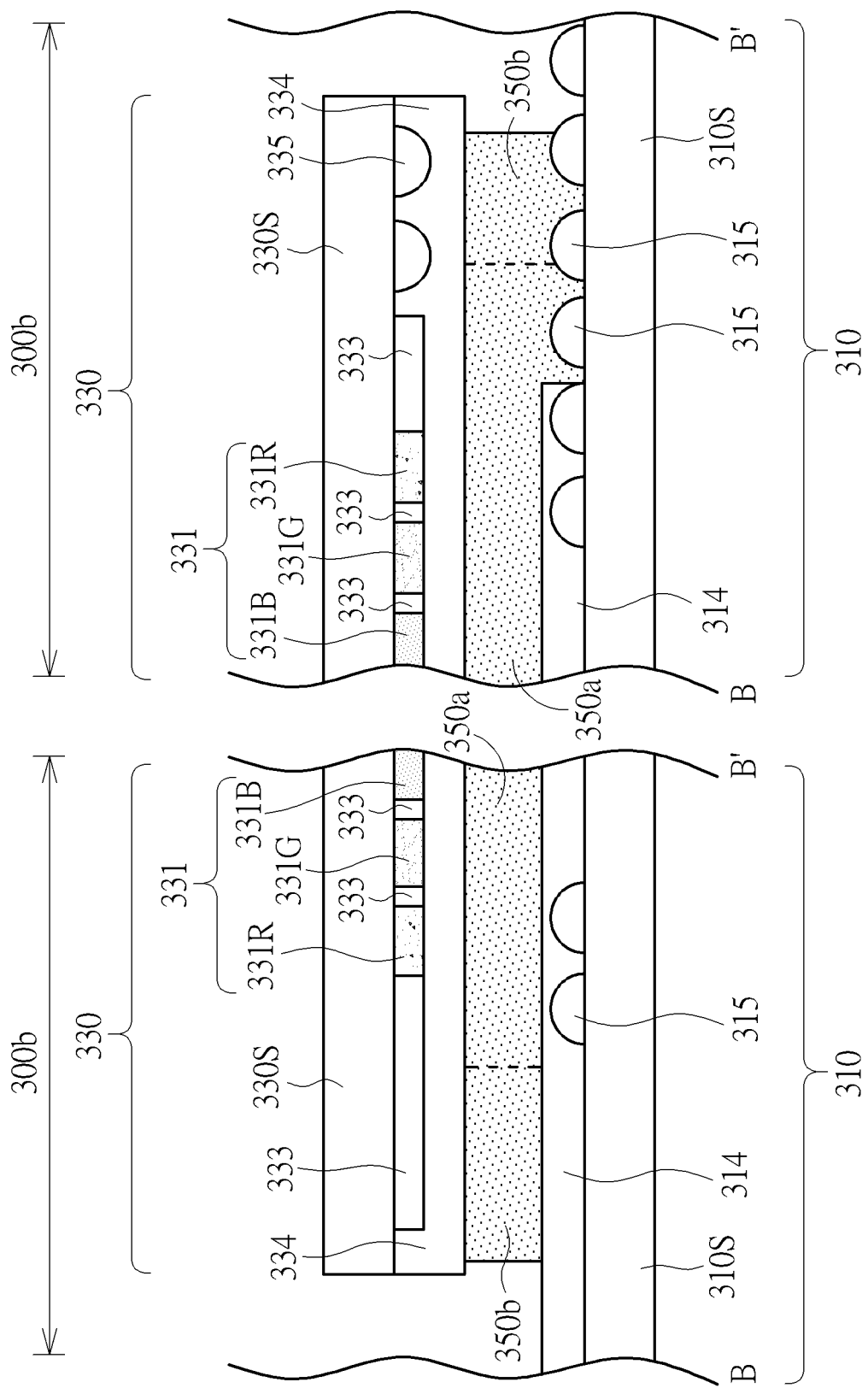
FIG. 6 is another schematic diagram illustrating a cross-sectional view of the non-active region in the electronic device according to the second embodiment of the present disclosure.

Furthermore, in another embodiment, the first substrate 310 or the second substrate 330 may further include a planarization layer disposed thereon to entirely cover or partially cover the elements or film layers on the first substrate layer 310S or the second substrate layer 330S, for example a planarization layer 314 or a planarization layer 334 as shown in FIG. 6. As shown in FIG. 6, the planarization layer 314 and the planarization layer 334 completely cover the light conversion layer 331, the light shielding layer 333, the dams 315 or dams 335 on the first substrate layer 310S or the second substrate layer 330S, and even cover the sidewall of the light shielding layer 333 to protect the light conversion layer 331. According to some embodiments, the second portion 350a may be disposed on the planarization layer 314 and/or the planarization layer 334, to overlap at least a portion of the dams 315 and/or dams 335. Or, according to some embodiments, the second portion 350a may be disposed on a portion of the dams 315 to fill in the gap between each dam 315, thereby improving the binding function of the second portion 350a, as shown in FIG. 6. According to some embodiments, the second portion 350a may be directly disposed on a portion of the dams 315.

Figure 7:
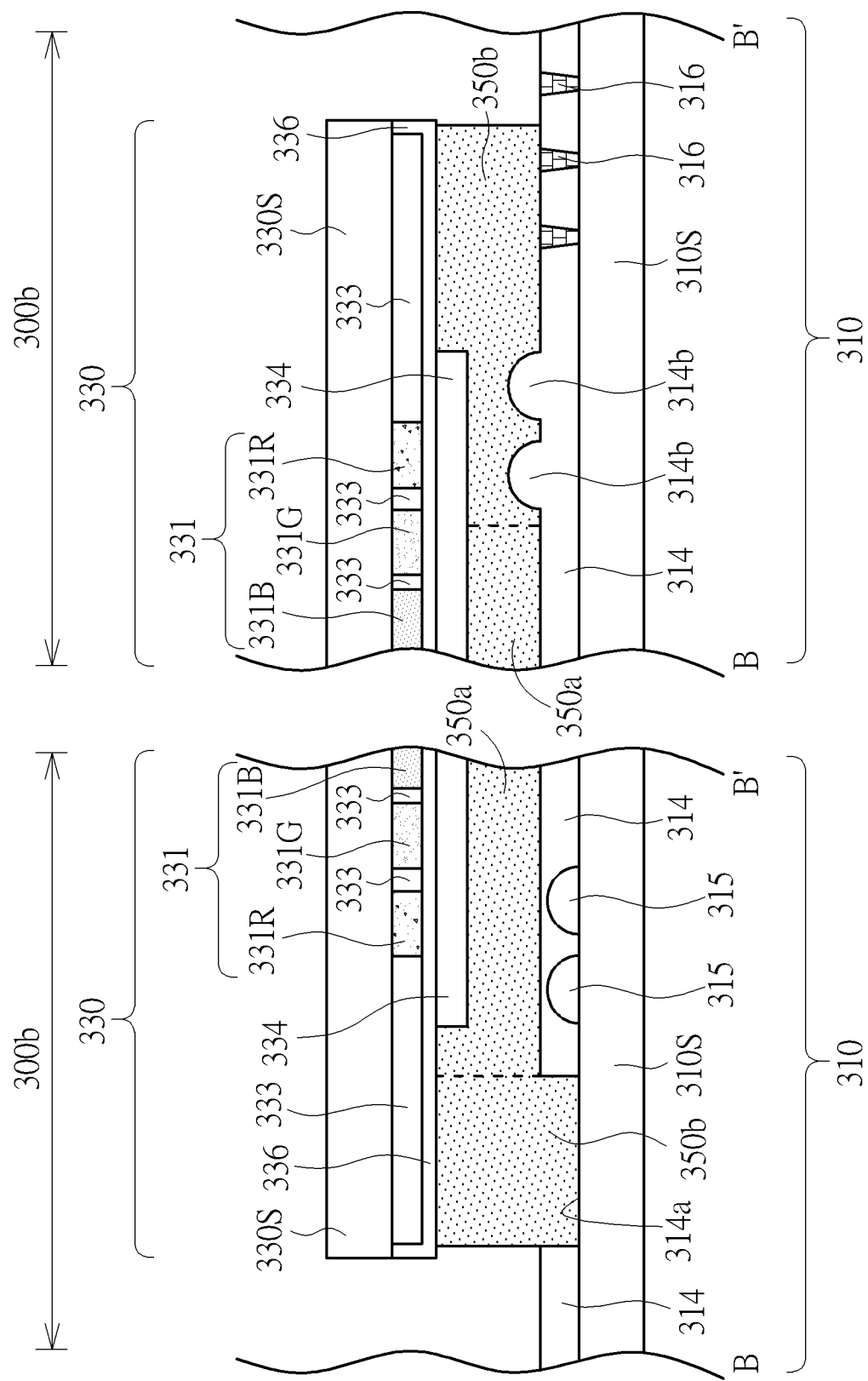
FIG. 7 is another schematic diagram illustrating a cross-sectional view of the non-active region in the electronic device according to the second embodiment of the present disclosure.
Figure 8:
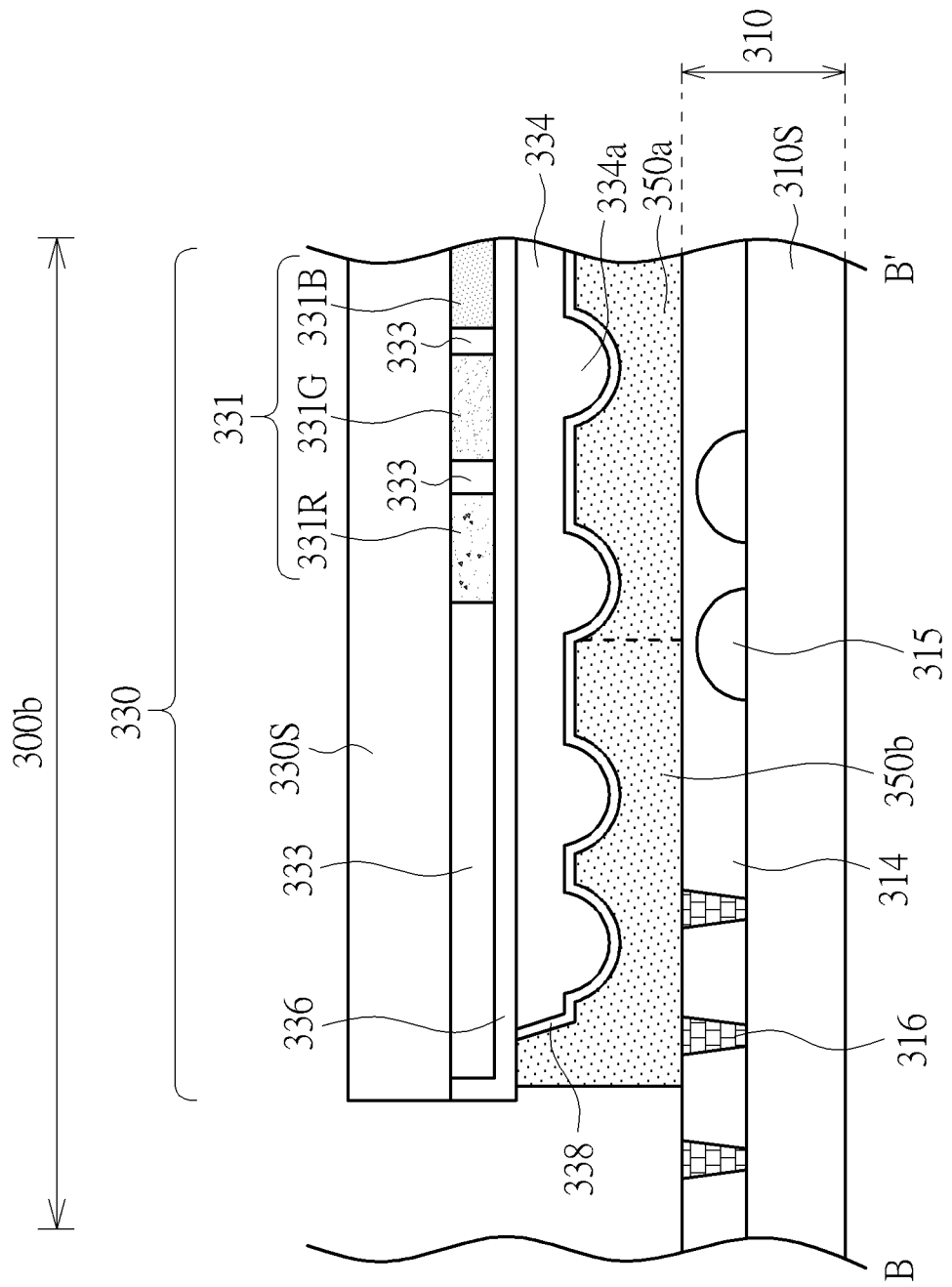
FIG. 8 is another schematic diagram illustrating a cross-sectional view of the non-active region in the electronic device according to the second embodiment of the present disclosure.

In another embodiment, as shown in FIG. 7, a portion of the light shielding layer 333 is exposed from the planarization layer 334. Accordingly, a covering layer 336 may be disposed additionally on the second substrate layer 330S to protect the light conversion layer 331 and the light shielding layer 333, followed by disposing the planarization layer 334. As shown in the left of FIG. 7, the second portion 350a may further cover the sidewall of the planarization layer 334 and a portion of the covering layer 336. Alternatively, the second portion 350a may only cover a portion of the planarization layer 334 without contacting the covering layer 336, as shown in the right of FIG. 7. Also, in another embodiment, the covering layer 336, the planarization layer 334 and another covering layer 338 sequentially disposed on the second substrate layer 330S may together form an inorganic material/organic material/inorganic material structure, to provide further protection. The covering layer 336 and the covering layer 338 may optionally include the same material, and a portion of the covering layer 338 may be further disposed on the sidewall of the planarization layer 334 and the covering layer 336 underneath, as shown in FIG. 8. One skilled in the art can easily understand that although the inorganic material/organic material/inorganic material structure is only exemplified by being formed on the second substrate layer 330S in the aforementioned embodiment, the planarization layer 314 on the first substrate layer 310S may also form a similar inorganic material/organic material/inorganic material structure (not shown in the drawings) in combination with additional covering layers (not shown in the drawings), to protect the film layers and/or the elements on the first substrate layer 310S. On the other hands, in order to improve the binding of the second portion 350a (or the first portion 350b) between the first substrate 310 and the second substrate 330, at least one trench 314a or at least one dam 314b or dam 334a may be further disposed in the planarization layer 314 and/or the planarization layer 334. Accordingly, the second portion 350a (or the first portion 350b) may fill in the trench 314a, the gap between the dams 314b, or the gap between the dams 334a, thereby improving the binding of the second portion 350a (or the first portion 350b) between the first substrate 310 and the second substrate 330, as shown in FIG. 7 or FIG. 8.

Figure 9:
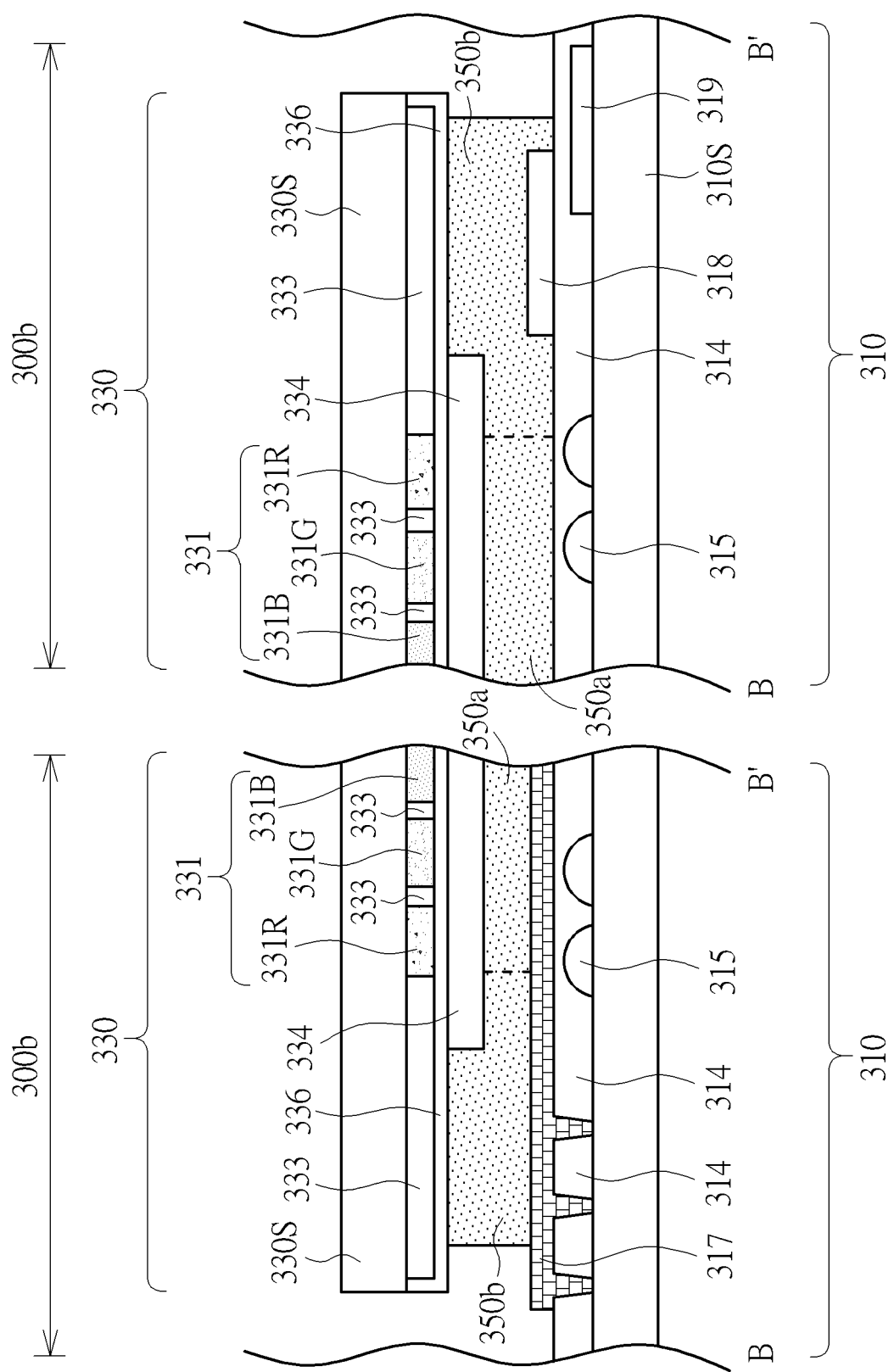
FIG. 9 is another schematic diagram illustrating a cross-sectional view of the non-active region in the electronic device according to the second embodiment of the present disclosure.

It is also noted that, the second portion 350a can extend as far as possible to the non-active region 300b, and the extending area of the first portion 350b may be further enlarged within the non-active region 300b, to effectively prevent the intrusion of water and oxygen from two sides of the electronic device 300, or to enhance the binding of the first portion 350b between the first substrate 310 and the second substrate 330. For example, the first portion 350b may extend from a side of the second portion 350a to the sidewall of the second substrate 330. In this way, in some embodiments or in some part of the electronic device 300, the first portion 350b may cover on the dummy light conversion unit (as shown in FIG. 5), or fill in the gap between each dam 315 on the first substrate layer 310S (or second substrate layer 330S) in the non-active region 300b (as shown in FIG. 6), or be disposed on the covering layer 336 or the sidewall of the planarization layer 334 (as shown in FIG. 7), or fill in the gap between each dam 334a on the planarization layer 334 in the non-active region 300b (as shown in FIG. 8), or cover on any possible element disposed in the non-active region 300b. Thus, the binding of the first portion 350b can be enhanced. The element may be disposed on the first substrate layer 310S or on the second substrate layer 330S, for example, an element 339 as shown in FIG. 5 or an element 319 as shown in FIG. 9, which may be an alignment mark or a metal line. The element may also be disposed in the planarization layer 314 or in the planarization layer 334, for example, a plug element 316 as shown in FIG. 7. The element may also be disposed on the planarization layer 314 or in the planarization layer 334, for example, an element 317 or an element 318 as shown in FIG. 9, which may be an anode, a cathode or an auxiliary electrode, but not limited thereto. However, under other process considerations, the first portion 350b may also be indented, namely, making the sidewall of the first portion 350b being not in alignment with the sidewall of the second substrate layer 330S as shown in FIG. 9. Alternatively, the first portion 350b may further extend to cover the sidewall of the second substrate layer 330S or the sidewall of the first substrate layer 310S as shown in FIG. 17, wherein FIG. 17 is a schematic diagram illustrating a cross-sectional view of a non-active region 300b taken along a cross line B-B' of the electronic device as shown in FIG. 3, according to another embodiment of the present disclosure.

Figure 17:
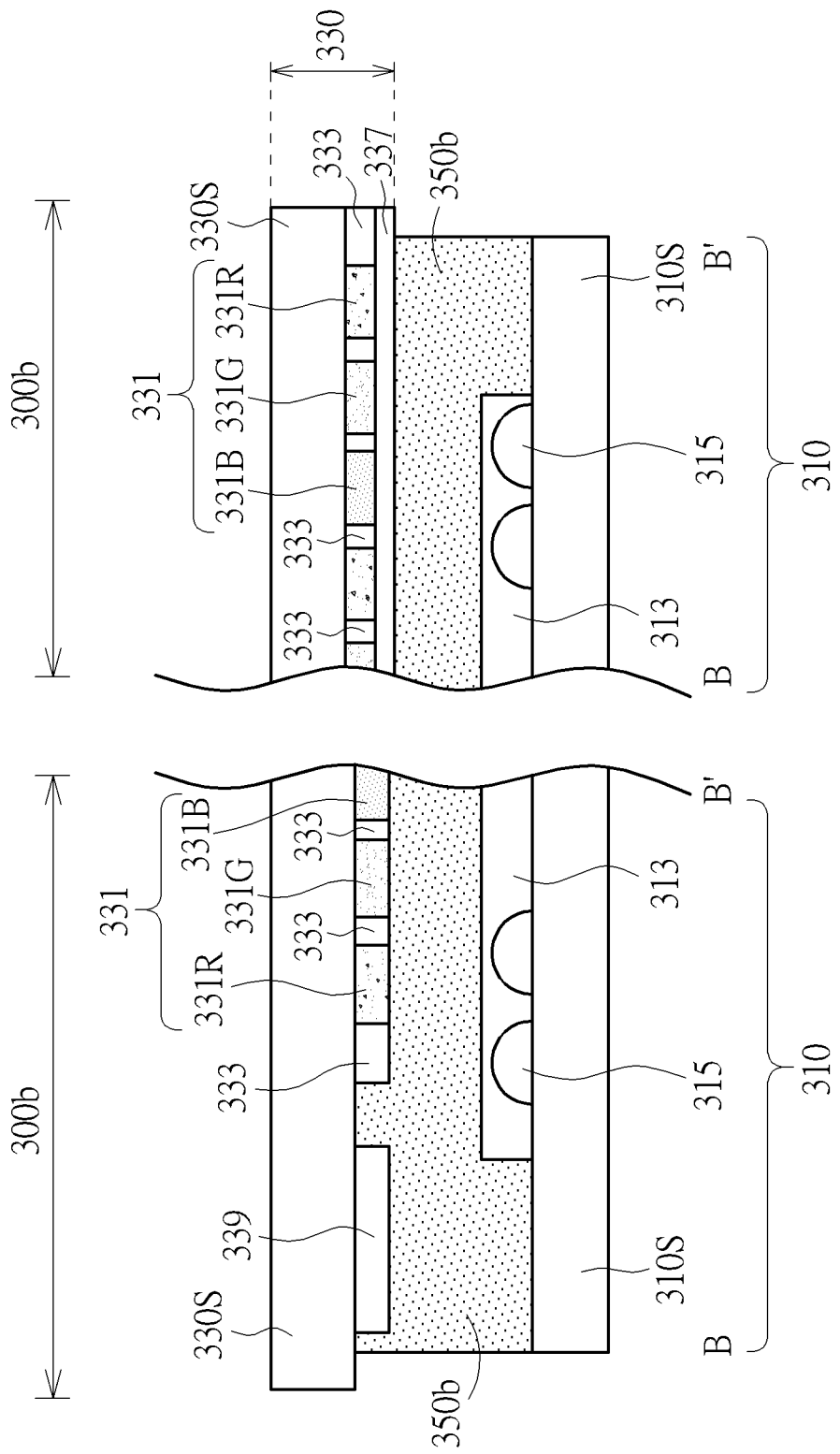
FIG. 17 is a schematic diagram illustrating a cross-sectional view of a non-active region in an electronic device according to another embodiment of the present disclosure.

In summary, in the electronic device of the present disclosure, the sealing layer is additionally disposed between two substrates to extend from the active region to the non-active region of the electronic device, even further covering the sidewall of the electronic device, such as the sidewalls of the first substrate layer 310S (as shown in FIG. 17) or the second substrate layer 330S, or even further covering the sidewalls of the elements or the film layers disposed on the first substrate layer or the second substrate layer, so as to achieve the structural reinforcement of the electronic device to improve the alignment accuracy between the two substrates. On the other hands, the sealing layer may provide the additional elastic supporting, block the intrusion of water and oxygen to the electronic device, or provide the refractive index matching in the active region. Moreover, one skilled in the art can also understand that, the technical features in different embodiments described in the following can be replaced, recombined, or mixed with one another to constitute another embodiment.

Figure 10:
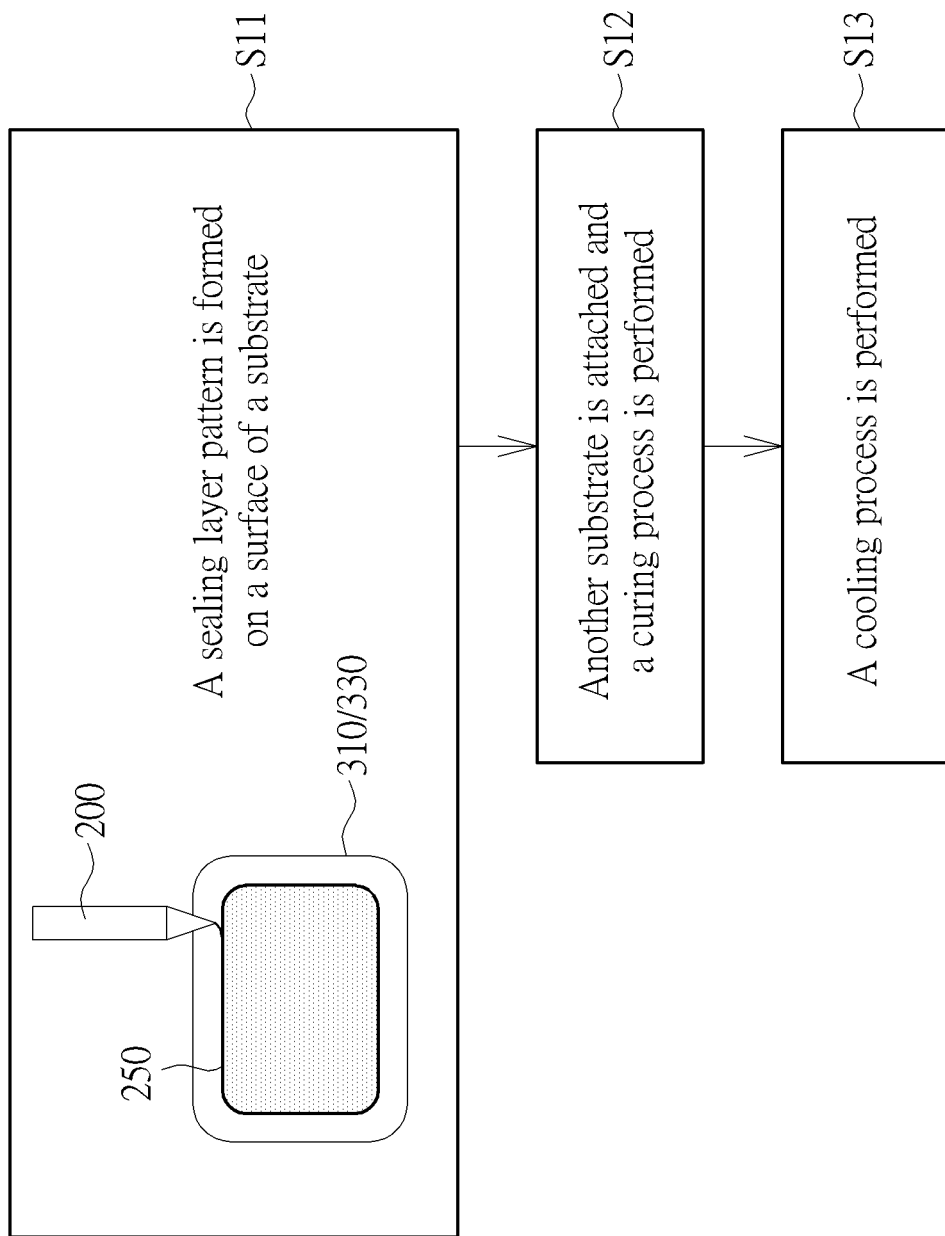
FIG. 10 is a schematic diagram illustrating a process flow of fabricating an electronic device according to the second embodiment of the present disclosure.

In the present embodiment, according to the similarities and differences of the materials of the first portion 350b and the second portion 350a, the electronic device 300 may be manufactured through different methods, as shown in Table 2 below. Please refer to FIG. 10, which shows a process flow of manufacturing the sealing layer 350 when the first portion 350b and the second portion 350a of the electronic device 300 include the same material. Firstly, a sealing layer pattern 250 is formed on a surface of a substrate (step S11), and the substrate may be the aforementioned first substrate 310 or the aforementioned second substrate 330. The sealing layer pattern 250 may include any shape or any type, is not limited to what is shown in FIG. 10. Precisely speaking, the sealing layer pattern 250 may be accomplished by performing a scraper process, a sealing pattern process, an anilox roller process or a nozzle process to form the sealing layer pattern 250 from the non-active region 300b to the active region 300a of the substrate. The nozzle process may include a dispenser process, a spray process, a slit coater process or an ink-jet printing process. For example, when the scraper process is performed, a syringe 200 is used to form a primary sealing layer pattern (not shown in the drawings) on at least a portion of the surface of the substrate via a pressure squeeze manner, and a scraper (not shown in the drawings) is used to scrape the primary sealing layer pattern from a non-active region (not shown in FIG. 10) at an outer periphery of the substrate to an active region (not shown in FIG. 10), to form an uniform thickness. In other processes, the substrate may also be sprayed, rolled, coated or printed through the same direction.

Figure 11:
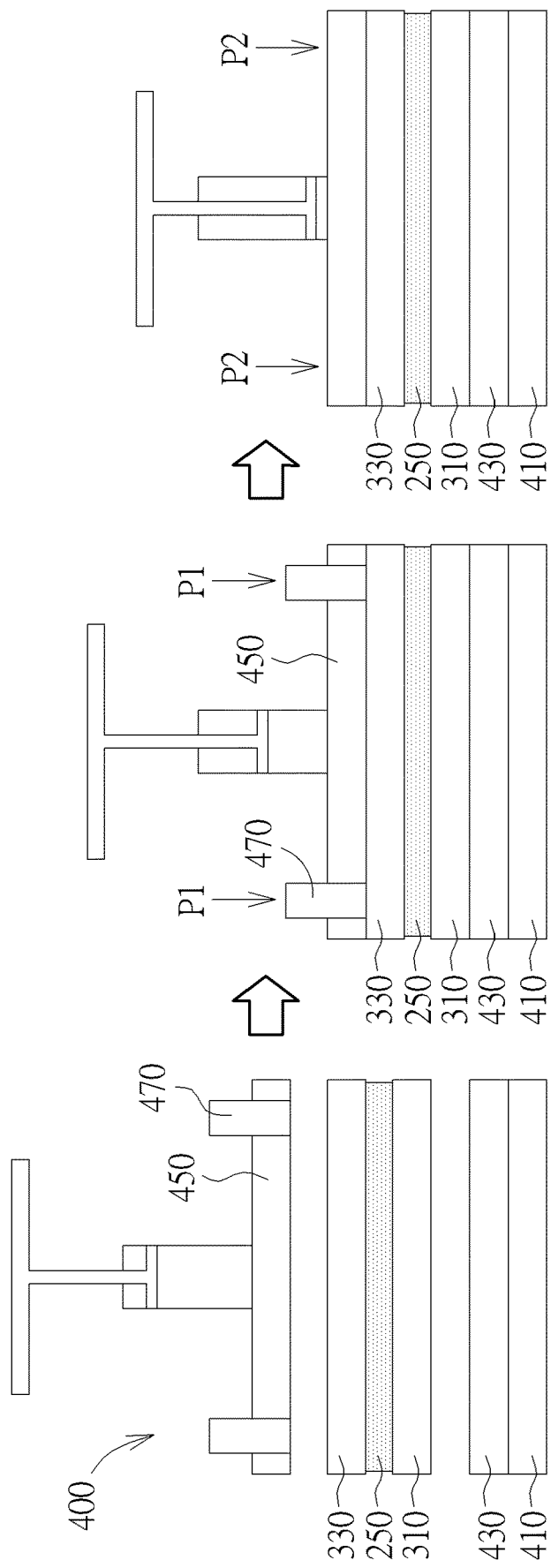
FIG. 11 is a schematic diagram illustrating a curing process according to the second embodiment of the present disclosure.

Next, another substrate is attached to the substrate and a curing process is then performed (step S12), and the another substrate may be the aforementioned second substrate 330 or the aforementioned first substrate 310. The curing process can be accomplished by using a machine 400 as shown in FIG. 11, the machine 400 includes a stage 410, and a hot plate 430 at the bottom and a hot plate 450 at the top are disposed on the stage 410. The two substrates which are attached with each other are disposed between the two hot plates 430, 450, to perform the curing process. In the present embodiment, the curing process may include different steps based on the material selection of the sealing layer pattern 250. For example, when the sealing layer pattern 250 include the aforementioned photocurable or thermally curable material, a pre-curing process P1 may be firstly performed on the non-active region 300b at the periphery of the two substrates, for example, using a UV fiber 470 extended from a hole (not shown in the drawings) disposed on two sides of the hot plate 450 for UV exposure, followed by pre-pressing the two substrate to prevent from displacement. The exposure energy of the UV fiber 470 is for example 4000 millijoules (mJ), and exposure locations B of the UV fiber 470 is for example shown in FIG. 12, which is at the periphery of the first substrate 310 and the second substrate 330 and in the non-active region 300b.

Figure 13:
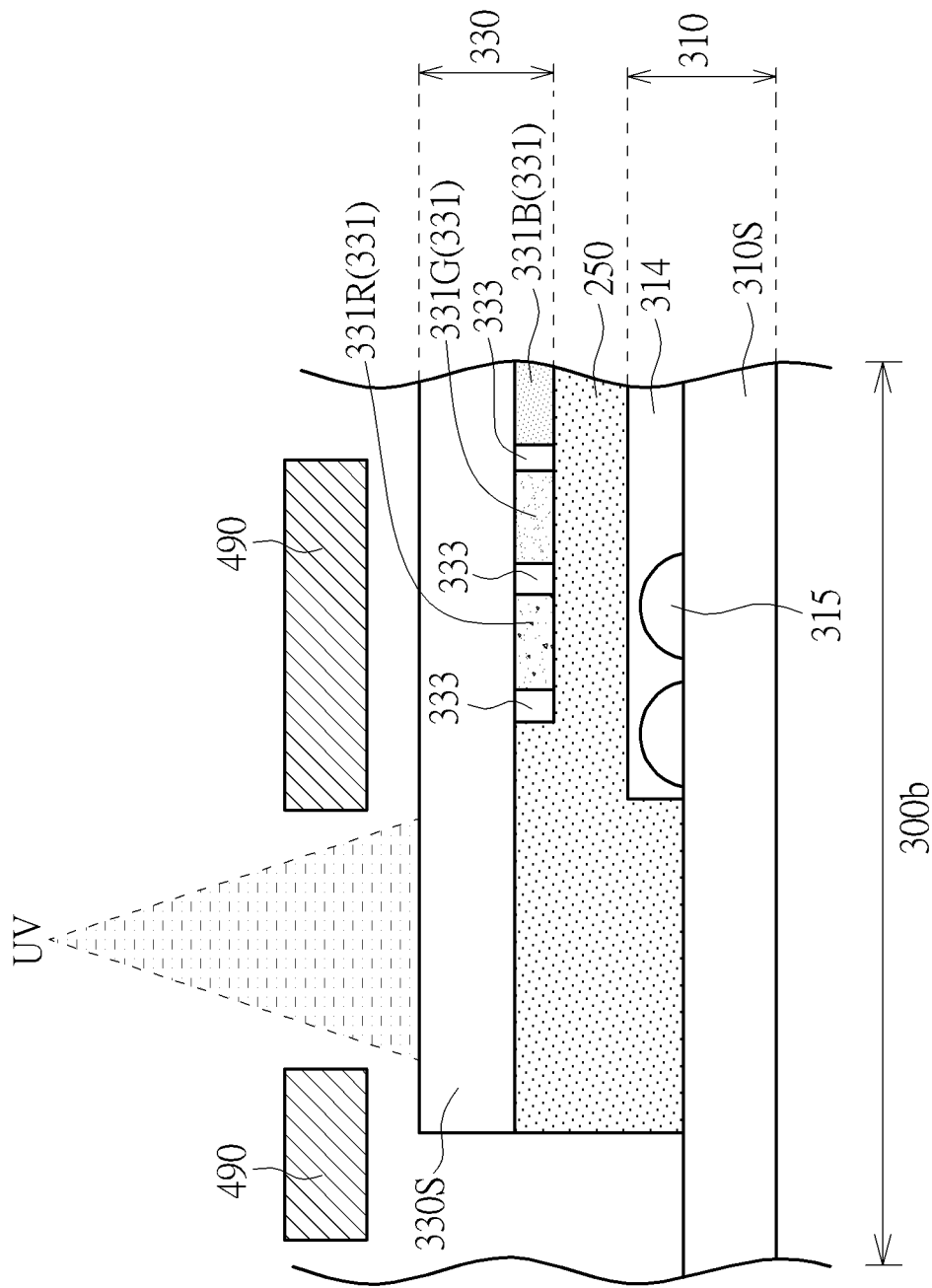
FIG. 13 is a schematic diagram illustrating an enlarged view of a portion of FIG. 12.
Figure 14:
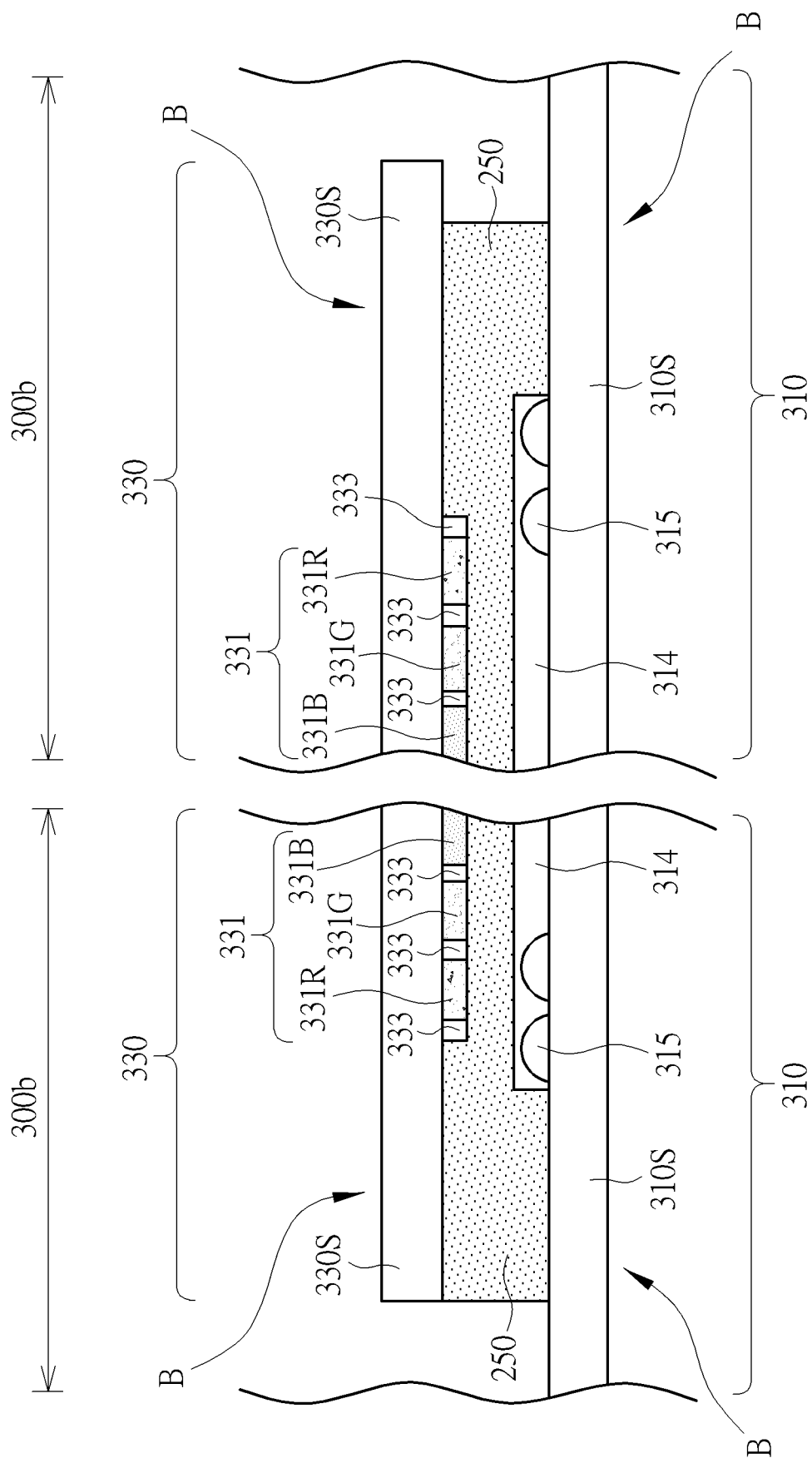
FIG. 14 is a schematic diagram illustrating a position of the pre-curing process according to the second embodiment of the present disclosure.

It is noted that, when performing the pre-curing process P1, a UV curing mask 490 as shown in FIG. 13 may be additionally disposed on the two substrates to cover regions which are unnecessary for exposure such as the active region 300a, thereby avoiding the light conversion layer 331 or the display layer 311 being damaged by the high energy of the UV exposure. Furthermore, in the present embodiment, although the UV exposure is carried out from the side of the first substrate 310, the practical performance thereof is not limited thereto. In another embodiment, the UV exposure may also be carried out from the side of the second substrate 330. Meanwhile, in order to avoid the transmittance being affected during the UV exposure, the exposure positions B may be located in the non-active region 300b, without being blocked by the light conversion unit 331R, the light conversion unit 331G, the light conversion unit 331B, the light-emitting unit 311a or other element, as shown in FIG. 14. In other words, when the transparent conductive layer 337 as shown in FIG. 5, the element 339 or the element 319 as shown in FIG. 5 or FIG. 9 (such as the alignment mark or the metal line), the element 316 as shown in FIG. 7 (such as the plug), or the element 317 or the element 318 as shown in FIG. 9 (such as the electrode) are disposed on the first substrate 310 or the second substrate 330, other curing processes such as the subsequent thermal curing process can be performed, instead of the aforementioned UV exposure.

Figure 15:
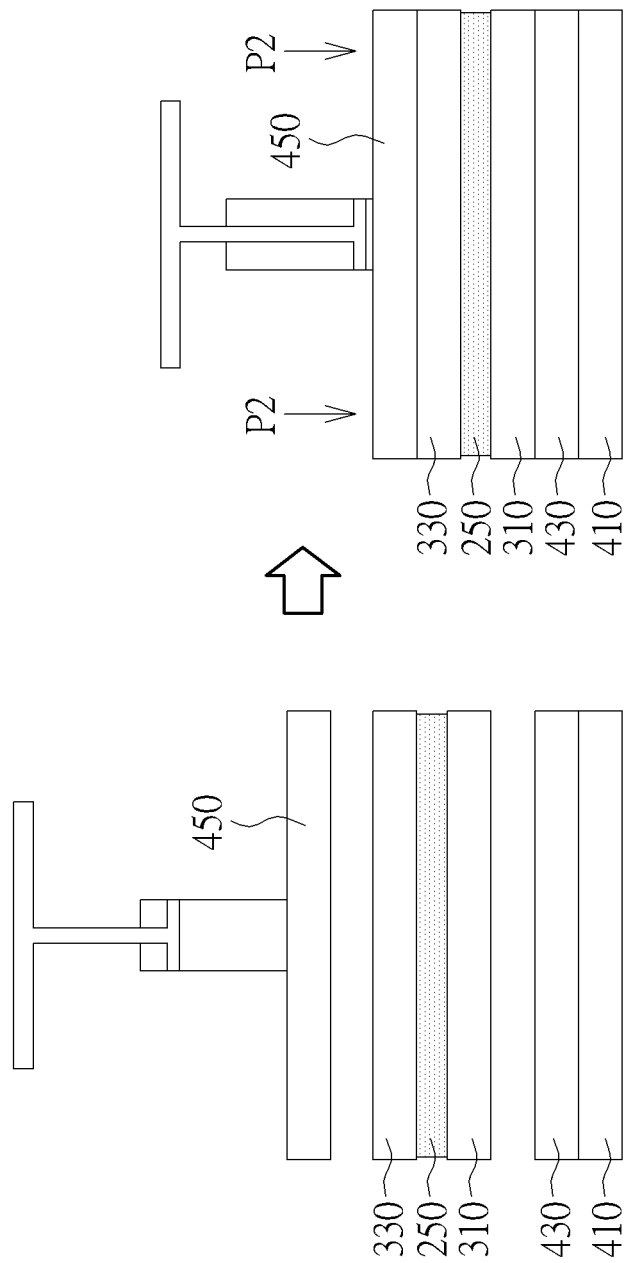
FIG. 15 is a schematic diagram illustrating another curing process according to the second embodiment of the present disclosure.

Then, a main curing process P2 is performed to hot press the two substrates under a suitable temperature. The suitable temperature may differ in accordance with the material selection of the sealing layer pattern 250, for example being between 75° C. and 125° C., but not limited thereto. On the other hand, when the sealing layer pattern 250 includes the aforementioned thermally curable material, the pre-curing process P1 may be omitted, and the main curing process P2 can be directly performed, as shown in FIG. 15. After the main curing process P2, the two substrates are transferred to a cooling machine (not shown in the drawings) to perform a cooling process (step S13). Accordingly, the electronic device 300 is formed thereby.

Figure 12:
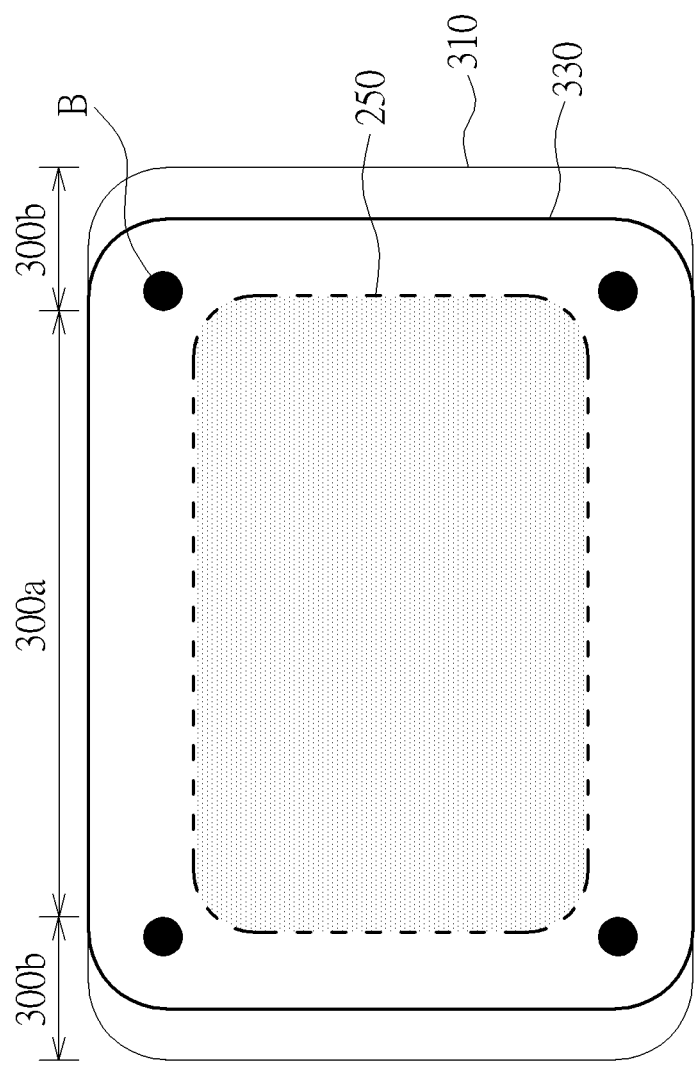
FIG. 12 is a schematic diagram illustrating a pre-curing process according to the second embodiment of the present disclosure.
Figure 16:
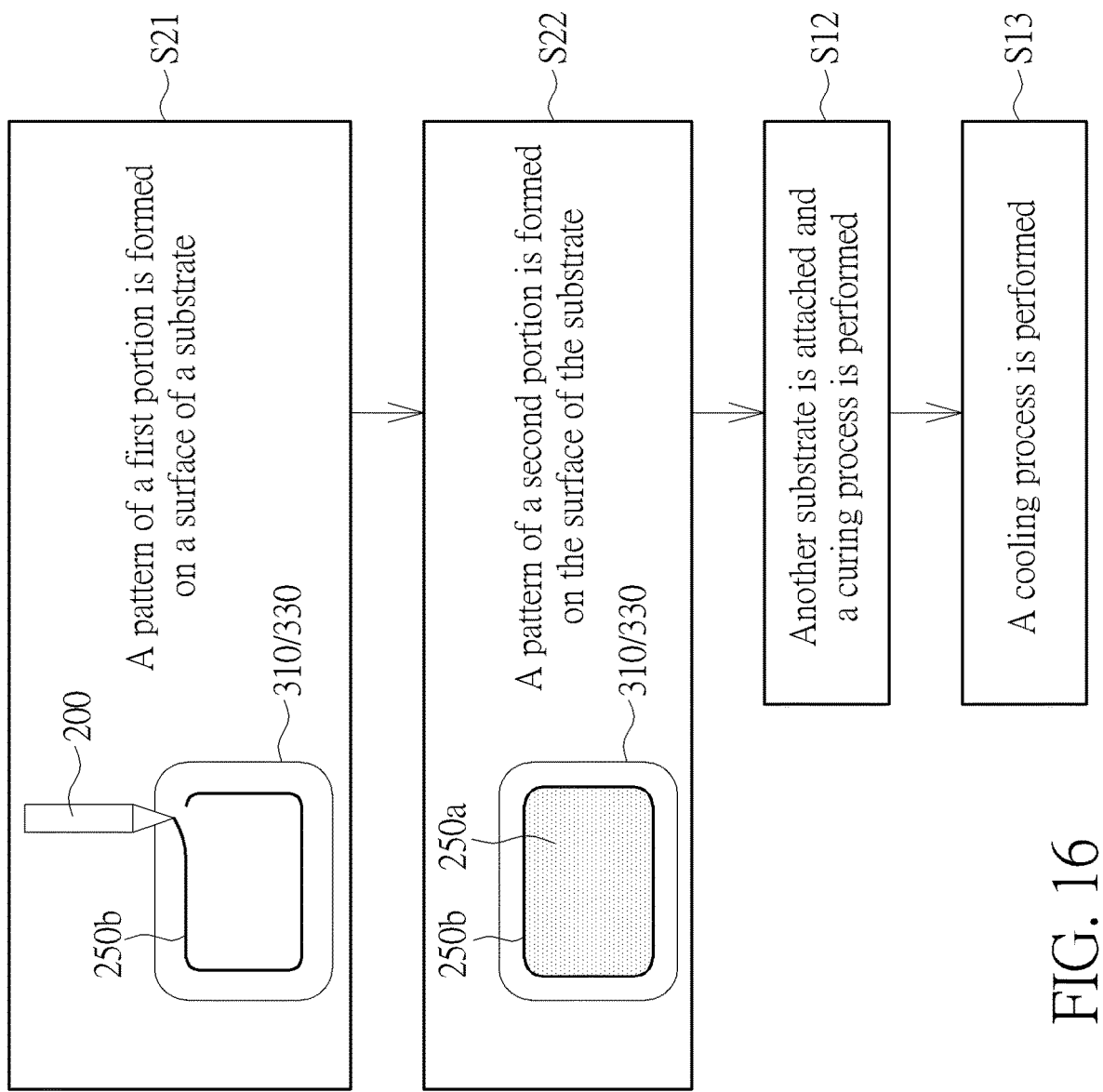
FIG. 16 is another schematic diagram illustrating another process flow of fabricating an electronic device according to the second embodiment of the present disclosure.

Please refer to FIG. 16, which shows a process flow of manufacturing the sealing layer 350 when the first portion 350b and the second portion 350a of the electronic device 300 include different materials. Firstly, a pattern of the first portion 250b is formed on a surface of a substrate (step S21), and the substrate may also be the aforementioned first substrate 310 or the aforementioned second substrate 330. The pattern of the first portion 250b is formed in the non-active region 300b through a screen printing process or a dispenser process, and the pattern of the first portion 250b may be formed in a closed rectangular shape, but is not limited thereto. Next, a pattern of the second portion 250a is formed on the surface of the substrate (step S22), for example through the aforementioned nozzle process, anilox roller process or sealant injecting process, and the pattern of the second portion 250a is formed inside the pattern of the first portion 250b via a manner of spraying, rolling, coating, printing or injecting. The pattern of the first portion 250b and the pattern of the second portion 250a may include any shape or any type, and the disposing positions thereof are not limited to what is shown in FIG. 16 and may have different arrangements according to the practical arrangements of the active region 300a and the non-active region 300b. For example, the pattern of the first portion 250b may be formed only at the necessary location for subsequent UV exposure (such as the exposure locations B as shown in FIG. 12) in the dispenser manner, or the pattern of the first portion 250b may be coated at whole region.

TABLE 2 fabricating methods of the electronic device

| | First Portion 350b and the Second Portion Including the Same Material | First Portion 350b and the Second Portion Including Different Materials |
|---|---|---|
| Dispenser Process (Nozzle process) | V | V |
| Scraper Process | V | — |
| Screen Printing Process | — | V |
| Spray Process (Nozzle Process) | V | V |
| Anilox roller process | V | V |
| Slit Coater Process (Nozzle Process) | V | V |
| Ink-Jet Printing process (Nozzle Process) | V | V |
| Sealent Injecting Process | V | V |

Subsequently, another substrate is also attached to the substrate, and the curing process (step S12) and the cooling process (step S13) are sequentially performed to form the electronic device 300. It is noted that, the operating machines, operating method and principle of the curing process (step S12) and the cooling process (step S13) are all substantially the same as those described above, and will not be redundant described thereinafter. Also, one skilled in the art can also understand that the fabrication of the electronic device 300 in the present disclosure is not limited to the aforementioned process flow or operating sequence, and which may also be accomplished through other methods. For example, in other embodiments, the pattern of the first portion 250b and the pattern of the second portion 250a may be formed on the surfaces of the first substrate 310 and the second substrate 330 respectively, and the first substrate 310 and the second substrate are then attached with each other.

One skilled in the art can easily realize that although the aforementioned embodiment of the present disclosure are mainly exemplified on the electronic device and the fabrication thereof, the sealing layer and the supporting element in the present disclosure may be further applied on other products such as other electronic device. The electronic device for example includes a display device, alighting device, an antenna device, a sensor device or a tiled device, but is not limited thereto. The electronic device may optionally include a foldable electronic device or a flexible electronic device, such as a liquid crystal (LC) display device or a light emitting diode display device, and the light emitting display device for example includes an organic light emitting diode (OLED) or an inorganic light emitting diode (LED), and the LED for example includes a mini-LED, a micro-LED, a quantum-dot LED (QLED, QDLED), fluorescence LED, phosphor LED, or a LED with any other suitable materials or materials in any combination, but is not limited thereto. The antenna device may be a liquid crystal antenna, but is not limited thereto. The tiled device may be a display tiled device or an antenna tiled device, but is not limited thereto. It is noteworthy that the electronic device may be any variants, arrangements or combinations of the above, but is not limited thereto.

According to some embodiments, by means of the design of the sealing layer, the first substrate including the display layer and the second substrate including the light conversion layer can be bonded with more precise alignment and/or with better supporting force.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device having an active region and a non-active region, comprising:
    a first substrate comprising a first substrate layer, a plurality of light-emitting units disposed on the first substrate layer in the active region, and a plurality of dams disposed on the first substrate layer in the non-active region, wherein a topmost surface of at least one of the plurality of dams is lower than a top surface of one of the plurality of light-emitting units;
    a second substrate comprising a plurality of light conversion units in the active region; and
    a sealing layer disposed between the first substrate and the second substrate, wherein the sealing layer comprises a first portion disposed in the non-active region and a second portion disposed in the active region, and the first portion and the second portion are continuous,
    wherein at least a part of the first portion of the sealing layer is disposed between at least two of the plurality of dams.

2. The display device according to claim 1, wherein the first portion of the sealing layer extends to a sidewall of the first substrate.

3. The display device according to claim 1, wherein the first portion of the sealing layer extends to cover a sidewall of the first substrate.

4. The display device according to claim 1, further comprising a planarization layer disposed on the first substrate layer, wherein the planarization layer is disposed between another two of the plurality of dams.

5. The display device according to claim 4, further comprising an element on the planarization layer, within the non-active region, wherein the first portion of the sealing layer directly contacts the element.

6. The display device according to claim 5, wherein the element comprises a plug, an anode, cathode, or auxiliary electrode.

7. The display device according to claim 1, wherein the first portion of the sealing layer extends to a sidewall of the second substrate.

8. The display device according to claim 1, wherein the first portion of the sealing layer extends to cover a sidewall of the second substrate.

9. The display device according to claim 1, wherein the first substrate further comprises a pixel defining layer disposed on the first substrate layer, and the plurality of light-emitting units is disposed in the pixel defining layer.

10. The display device according to claim 9, wherein a portion of the pixel defining layer is disposed between another two of the plurality of dams.

11. The display device according to claim 10, wherein the another two of the plurality of dams are partially exposed from the pixel defining layer.

12. The display device according to claim 9, wherein the first portion of the sealing layer directly contacts the pixel defining layer.

13. The display device according to claim 9, wherein the pixel defining layer covers a part of the plurality of dams.

14. The display device according to claim 1, wherein a viscosity of the first portion of the sealing layer is greater than a viscosity of the second portion of the sealing layer.

15. The display device according to claim 1, further comprising a plurality of first supporting elements in the first portion, and a plurality of second supporting elements in the second portion, and a length of the plurality of the first supporting elements is greater than a length of the plurality of second supporting elements.

16. The display device according to claim 15, wherein a supporting force of the plurality of the second supporting elements is greater than a supporting force of the plurality of first supporting elements.

17. The display device according to claim 15, wherein the plurality of first supporting elements and the plurality of the second supporting elements comprise plastic core, glass ball, photoinitiator, acrylate resin, esterified epoxy, synthetic resin, fiber, spacer, or polymer core.

18. The display device according to claim 1, wherein the sealing layer comprises an adhesive material, a thermally curable material, or a photocurable material.

19. The display device according to claim 1, wherein the first portion of the sealing layer surrounds the second portion of the sealing layer in a top view of the display device.

20. The display device according to claim 1, wherein a refractive index of the sealing layer is 1.3 to 1.6.

* * * * *